(12) United States Patent
Han et al.

(10) Patent No.: US 10,648,926 B2
(45) Date of Patent: May 12, 2020

(54) METHOD OF DETECTING PARTICLES ON PANEL

(71) Applicant: SHANGHAI MICRO ELECTRONICS EQUIPMENT (GROUP) CO., LTD., Shanghai (CN)

(72) Inventors: Xueshan Han, Shanghai (CN); Yongqiang Shen, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/338,336

(22) PCT Filed: Sep. 26, 2017

(86) PCT No.: PCT/CN2017/103334
§ 371 (c)(1),
(2) Date: Mar. 29, 2019

(87) PCT Pub. No.: WO2018/059376
PCT Pub. Date: Apr. 5, 2018

(65) Prior Publication Data
US 2020/0025691 A1    Jan. 23, 2020

(30) Foreign Application Priority Data
Sep. 30, 2016  (CN) .......................... 2016 1 0877673

(51) Int. Cl.
*G01N 21/88*   (2006.01)
*G01N 21/94*   (2006.01)
(Continued)

(52) U.S. Cl.
CPC ...... *G01N 21/9501* (2013.01); *G01N 15/0227* (2013.01); *G01N 21/8806* (2013.01); *G03F 7/7065* (2013.01); *G03F 7/7085* (2013.01)

(58) Field of Classification Search
CPC ............. G01N 21/956; G01N 21/8806; G01N 21/95607; G01N 15/14; G01N 23/2251;
(Continued)

(56) References Cited

U.S. PATENT DOCUMENTS 5,978,078 A    11/1999  Salamati-Saradh et al.
2006/0290923 A1*  12/2006  Nakano ................. G01N 21/47
356/237.3

FOREIGN PATENT DOCUMENTS

CN    101021490 A    8/2007
CN    101339143 A    1/2009
(Continued)

*Primary Examiner* — Mesfin T Asfaw
(74) *Attorney, Agent, or Firm* — Muncy, Geissler, Olds & Lowe, PC

(57) ABSTRACT

A method for detecting degree of particulate contamination on a flat panel mainly includes the following steps: illuminating a to-be-detected flat panel (40) by using a light source module (10), to form an illumination field; adjusting a half width of the illumination field; adjusting a luminous intensity at a center of the illumination field and a luminous intensity at an edge of the half width of the illumination field; adjusting a light intensity and a position of the light source, as well as a position of a detector (20); and acquiring signals from foreign objects on the flat panel by using the detector (20). This method greatly alleviates particle mirror crosstalk and crosstalk of patterns on the lower surface of the flat panel, and improves the SNR, thus enhancing the accuracy in detection of foreign objects on the flat panel.

8 Claims, 2 Drawing Sheets

(51) Int. Cl.
*G01N 21/95* (2006.01)
*G01N 21/956* (2006.01)
*G01N 15/02* (2006.01)
*G03F 7/20* (2006.01)

(58) Field of Classification Search
CPC ......... G01N 15/0806; G01N 15/1012; G01N 15/1459; G01N 21/8851; G01N 21/88; G01N 2021/8845; G01N 15/06; G01N 15/1475; G01N 1/00; G01N 2015/1018; G01N 2015/1486; G01N 2015/149; G01N 2015/1493; G01N 2021/4711; G01N 2021/646; G01N 2021/8825; G01N 21/39; G01N 21/645; G01N 21/94; G01N 2201/06113; G01N 23/046; G01N 23/223; G01N 29/4445; G01N 15/00; G01N 15/02; G01N 15/04; G01N 15/0612; G01N 15/10; G01N 15/1463; G01N 1/18; G01N 1/2202; G01N 1/2226; G01N 1/40; G01N 2001/002; G01N 2015/0042; G01N 2015/1087; G01N 2015/1093; G01N 2015/1497; G01N 2021/1765; G01N 2021/8835; G01N 2021/8883; G01N 2021/9513; G01N 21/55

See application file for complete search history.

(56) References Cited

FOREIGN PATENT DOCUMENTS

| | | |
|---|---|---|
| CN | 101655534 A | 2/2010 |
| CN | 1662808 A | 6/2010 |
| CN | 102519968 A | 6/2012 |
| CN | 102768969 A | 11/2012 |
| CN | 104897693 A | 9/2015 |
| CN | 105372256 A | 3/2016 |
| CN | 106257998 A | 12/2016 |
| JP | 4234945 B2 | 3/2009 |
| TW | I427286 | 2/2014 |
| TW | 201409021 A | 3/2014 |
| TW | I444610 | 7/2014 |

* cited by examiner

METHOD OF DETECTING PARTICLES ON PANEL

TECHNICAL FIELD

The present invention relates to the technical field of detecting degree of particulate contamination, and in particular, to a method for detecting degree of particulate contamination on a flat panel.

BACKGROUND

To improve product yield, pollution control is a. crucial link in a preparation process of a semiconductor integrated circuit or flat-panel display. Before exposure to light, a mask, a silicon wafer, a glass substrate, or the like needs to be subjected to detection of foreign objects, such as foreign particles, fingerprints, scratches, pinholes, etc.

A particle detection device integrated inside a photolithography apparatus generally uses a dark-flied scatterometry technique, of which a detection principle is shown in FIG. 1. Light 101 emitted from a radiation light source 10 is incident on a to-be-detected flat panel 40 at a particular angle, and then is scattered by foreign objects on the to-be-detected flat panel 40. Scattered signal light 102 enters a detection unit 20 right opposite the to-be-detected fiat panel 40. However, the detection device is structurally subjected to particle mirror crosstalk, which becomes severer when the lower surface of the detected flat panel is a chrome mask. In addition, crosstalk of patterns on the lower surface of the flat panel 40 also seriously affects the signal-to-noise ratio (SNR) of a detection signal, thus affecting the detection accuracy. For example, the lower surface of a mask is a chrome layer, and patterns to be exposed to light are formed in the chrome layer. When particles exist on the upper surface of the mask, the chrome layer is equivalent to a mirror, and these particles form virtual images with respect to the chrome layer, which are referred to as mirrored particles. As a result, particle mirror crosstalk occurs, which affects the detection.

SUMMARY OF THE INVENTION

To overcome the existing problems, the present invention provides a method for detecting degree of particulate contamination on a flat panel, which greatly alleviates particle mirror crosstalk and crosstalk of patterns on the lower surface of the flat panel, and improves the SNR, thus enhancing the detection accuracy.

To achieve the foregoing objective, the technical solution of the present invention is as follows:

A method for detecting degree of particulate contamination on a flat panel includes the following steps:

illuminating a to-be-detected flat panel by using a light source, and thereby forming an illumination field;

adjusting a half width of the illumination field;

adjusting a luminous intensity at a center of the illumination field and a luminous intensity at an edge of the half width of the illumination field;

adjusting a light intensity and a position of the light source, as well as a position of a detector; and acquiring signals from foreign objects on the to-be-detected flat panel by using the detector.

Alternatively, the step of adjusting a half width of the illumination field includes: enabling the half width of the illumination field to satisfy: s<=2h*tan θ−0.5w, wherein s indicates the half width of the illumination field, h indicates a thickness of the to-be-detected flat panel, θ indicates a refraction angle, in the to-be-detected flat panel, of a receiving angle of the detector , and w indicates a width of an imaging field.

Alternatively, the step of adjusting a luminous intensity at a center of the illumination field and a luminous intensity at an edge of the half width of the illumination field comprises: enabling the luminous intensity at the center of the illumination field and the luminous intensity at the edge of the half width of the illumination field to satisfy: i_center/i_edge> (i_min p1/i_max p1_mir)*snr1, wherein i_center indicates the light luminous at the center of the illumination field, i_edge indicates the luminous intensity at the edge of the half width of the illumination field, i_min p1 indicates a received signal of a to-be-detected minimal particle, i_max p1_mir indicates a mirror crosstalk signal of a to-be-detected maximal particle, and snr1 indicates a signal-to-noise ratio required for suppressing particle crosstalk.

Alternatively, the step of adjusting a half width of the illumination field includes: enabling the half width of the illumination field to satisfy: s<=h*(tan θ+tan γ), wherein s indicates the half width of the illumination field, h indicates a thickness of the to-be-detected flat panel, θ indicates a refraction angle, in the to-be-detected flat panel, of a receiving angle of the detector, and γ indicates a refraction angle, in the to-be-detected flat panel, of an incident angle of the light source.

Alternatively, the step of adjusting a luminous intensity at a center of the illumination field and a luminous intensity at an edge of the half width of the illumination field comprises: enabling the luminous intensity at the center of the illumination field and the luminous intensity at the edge of the half width of the illumination field to satisfy: i_center/i_edge> (i_min p2/i_max p2)*snr2, wherein i_center indicates the luminous intensity at the center of the illumination field; i_edge indicates the luminous intensity at the edge of the half width of the illumination field, i_min p2 indicates a received signal of a to-be-detected minimal pattern on the to-be-detected flat panel, i_max p2 indicates a maximal crosstalk signal of a pattern on the to-be-detected flat panel, and snr2 indicates a signal-to-noise ratio required for suppressing pattern crosstalk on the to-be-detected flat panel.

Alternatively, the detection unit is a planar-array camera, a linear-array camera, or a TDI linear-array camera.

Alternatively, the light source is a laser source or an LED light source.

Alternatively, the method further includes: selecting the incident angle of the light source and the receiving angle of the detector by using simulation software, and disposing the light source and the detector according to the incident angle and the receiving angle.

The present invention provides a method for detecting degree of particulate contamination on a flat panel, which adjusts the light intensity and a position of a light source module and a position of a detector by adjusting a half width of an illumination field, the luminous intensity at the center of the illumination field, and the luminous intensity at the edge of the half width of the illumination field. This method greatly alleviates particle mirror crosstalk and crosstalk of patterns on the lower surface of the flat panel, and improves the SNR, thus enhancing the accuracy in detection of foreign objects on the flat panel.

DETAILED DESCRIPTION

To make the objective and technical solutions of the present invention clearer, the method of the present invention is clearly and completely described below with reference to the accompanying drawings and specific embodiments.

Figure 1:
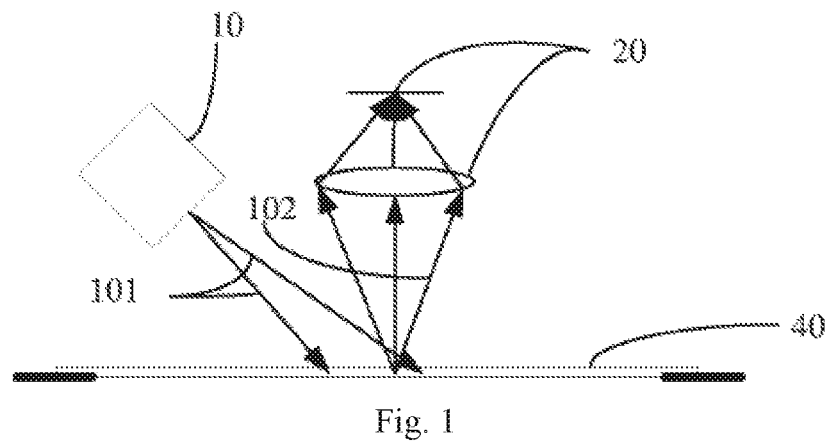
FIG. 1 is a schematic structural diagram of a foreign matter detection system for a flat panel in the prior art.
Figure 2:
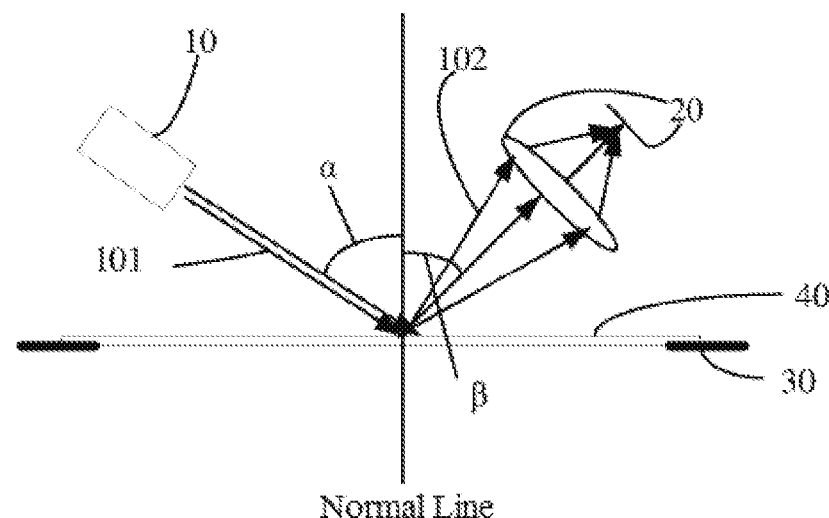
FIG. 2 is a schematic structural diagram of a foreign matter detection system in an embodiment of the present invention.
Figure 3:
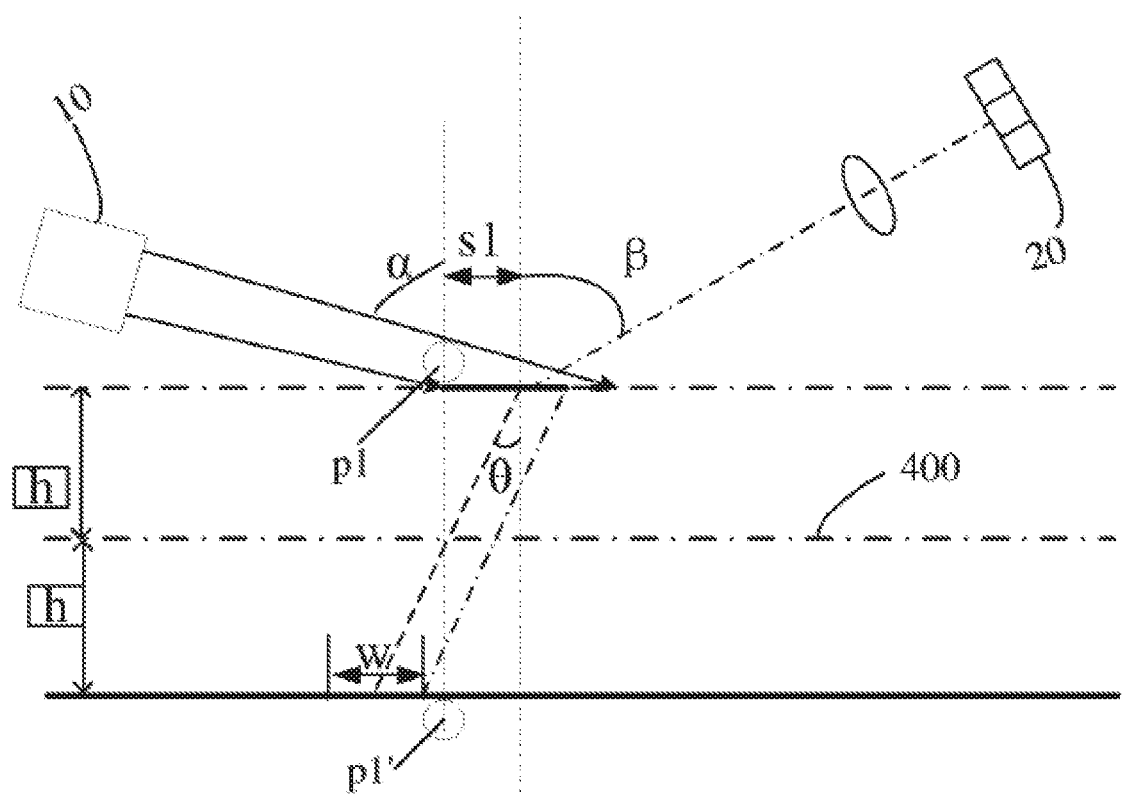
FIG. 3 is a schematic diagram showing suppression of particle mirror crosstalk in an embodiment of the present invention.
Figure 4:
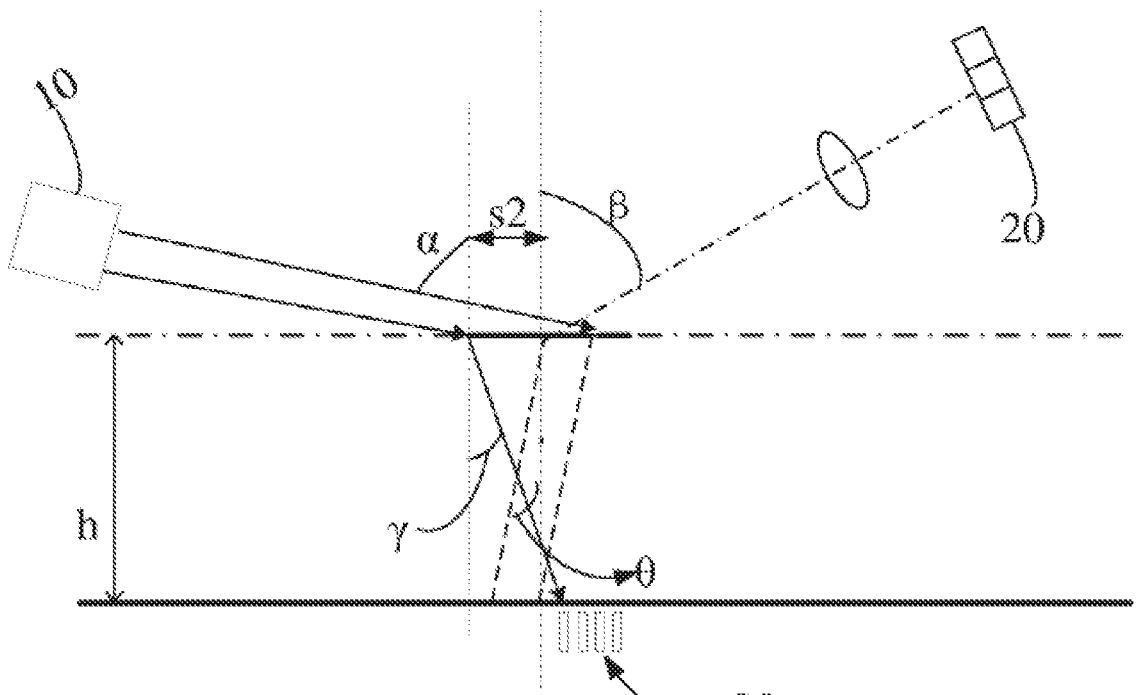
FIG. 4 is a schematic diagram showing suppression of image crosstalk on a flat panel in an embodiment of the present invention.

As shown in FIG. 2 to FIG. 4, the present invention provides a method for detecting degree of particulate contamination on a flat panel, which includes the following process.

Light 101 emitted from a light source module 10 is incident on a to-be-detected flat panel 40, to form an illumination field. Specifically, the light source module 10 is disposed above the to-be-detected flat panel 40, and the light 101 produced by the light source module 10 is incident on the to-be-detected flat panel 40 at an incident angle α. Herein, the incident angle refers to an angle between the light 101 and the line (which is the "normal line" in the figure) perpendicular to the surface of the to-be-detected flat panel. A detection unit 20 is disposed above the to-be-detected flat panel 40 and on opposite side with respect to the light source module 10, to form a detection receiving angle β. Herein, the detection receiving angle refers to an angle between an axis perpendicular to a detection surface of the detection unit 20 and the normal line. The light 101 is scattered by foreign objects on the to-be-detected flat panel 40 to produce signal light 102 which then enters the detection unit 20. The detection unit 20 may be a planar-array camera, a linear-array camera, or a TDI linear-array camera. In this embodiment, the detection unit 20 is preferably a CCD camera. The light source module 10 can be used to produce laser light or LED light. In this embodiment, the light source module 10 is preferably an LED lamp.

Then, particle mirror crosstalk is suppressed by adjusting a half width of the illumination field and corresponding luminous intensity. Specifically, to suppress the particle mirror crosstalk, the half width of the illumination field is adjusted according to parameters (for example, the thickness and the index of refraction) of the to-be-detected flat panel and parameters (for example, the width of an imaging field) of the detection unit 20, such that the half width s1 of the illumination field meets the following formula:

$$s1 <= 2h*\tan\theta - 0.5w \quad \text{(formula 1)}$$

As marked in FIG. 3, a broken line 400 indicates a position of the lower surface (that is, a chrome layer) of the to-be-detected flat panel 40; h indicates the thickness of the to-be-detected flat panel 40; p1 indicates a particle on the upper surface of the to-be-detected flat panel 40, which forms a virtual image p1' with respect to the chrome layer (denoted by the broken line 400); θ indicates an angle of refraction of detection received light (corresponding to the receiving angle β) through the flat panel; and w indicates the width of an imaging field of the detection unit 20.

Afterwards, based on the half width s1 of the illumination field, luminous intensity at the center of the illumination field and luminous intensity at the edge of the half width s1 of the illumination field are further adjusted. Specifically, the ratio of the luminous intensity at the center of the illumination field to the luminous intensity at the edge of the half width s1 of the illumination field is adjusted according to strength of a detection signal and strength of an interference signal, such that the luminous intensity at the center of the illumination field and the luminous intensity at the edge of the half width s1 of the illumination field meet the following formula:

$$i\_center/i\_edge > (i\_min\, p1/i\_max\, p1\_mir) * snr1 \quad \text{(formula 2)}$$

Herein, i_center indicates the luminous intensity at the center of the illumination field; i_edge indicates the luminous intensity at the edge of the half width s1 of the illumination field; i_min p1 indicates strength of a received signal of a to-be-detected minimal particle, for example, strength of a signal of a to-be-detected minimal particle received within a certain integral time by a detector, which may be obtained through simulating calculation; i_max p1_mir indicates strength of a mirror crosstalk signal of a to-be-detected maximal particle, for example, strength of a mirror crosstalk signal of a to-be-detected maximal particle received within a certain integral time by a detector, which may also be obtained through simulating calculation; and snr1 indicates an SNR which needs to be met to suppress the particle mirror crosstalk.

Subsequently, image crosstalk on the flat panel may be further suppressed by adjusting the half width of the illumination field and corresponding luminous intensity. Specifically, to suppress the image crosstalk on the flat panel, a half width s2 of the illumination field is adjusted according to the thickness of the to-be-detected flat panel and placement angles of the light source module 10 and the detection unit 20 with respect to the to-be-detected flat panel, such that the half width s2 of the illumination field meets the following formula:

$$s2 <= h*(\tan\theta + \tan\gamma) \quad \text{(formula 3)}$$

As marked in FIG. 4, a dot dash line indicates the upper surface of the to-be-detected flat panel; a solid line 400 indicates the lower surface (namely, the chrome layer) of the to-be-detected flat panel; h indicates the thickness of the to-be-detected flat panel; four small rectangles schematically indicate a pattern 30 (when the to-be-detected flat panel is a mask, the pattern 30 is a pattern to be exposed to light on the mask) formed on the chrome layer; θ indicates an angle of refraction of detection received light (corresponding to the receiving angle β) through the flat panel; and γ indicates an angle of refraction of incident light (corresponding to the incident angle α) through the flat panel.

Afterwards, based on the half width s2 of the illumination field, luminous intensity at the center of the illumination field and luminous intensity at the edge of the half width s2 of the illumination field are further adjusted. Specifically, the ratio of the luminous intensity at the center of the illumination field to the luminous intensity at the edge of the half width s2 of the illumination field is adjusted according to strength of a detection signal and strength of an interference signal, such that the luminous intensity at the center of the illumination field and the luminous intensity at the edge of the half width s2 of the illumination field meet the following formula:

$$i\_center/i\_edge > (i\_min\, p2/i\_max\, p2) * snr2 \quad \text{(formula 4)}$$

Herein, i_center indicates the luminous intensity at the center of the illumination field; i_edge indicates the luminous intensity at the edge of the half width s2 of the illumination field; i_min p2 indicates strength of a received signal of a to-be-detected minimal image; i_max p2 indicates strength of a signal with the maximal image crosstalk on the flat panel; and snr2 indicates an SNR which needs to be met to suppress the image crosstalk on the flat panel. The strength of the detection signal and the strength of the interference signal in the above respectively refer to, for example, detection signal energy and image crosstalk signal energy which are obtained within a certain integral time by a detector.

Subsequently, the light intensity and a position of the light source module 10, and a position of the detection unit 20 are adjusted.

Finally, signals produced by the foreign objects on the to-be-detected flat panel 40 are acquired by using the detection unit 20.

The method for detecting degree of particulate contamination on a flat panel of the present invention is described with reference to a set of data below: A dynamic range of the detected particle p1 is 5 μm to 1000 μm, an image interval on the flat panel ranges from 80 nm to 1 μm, the width w of the imaging field is 1 mm, the index of refraction of the flat panel is 1.46, the thickness h of the flat panel is 3 mm, an incident angle α of a light source ranges from 75° to 80°, a receiving angel β of the detection unit ranges from 55° to 60°, the SNR which needs to be met to suppress particle crosstalk is 5, and the SNR which needs to be met to suppress image crosstalk on the fiat panel is 2.

The following result can be obtained from the above:

To suppress the particle mirror crosstalk and image crosstalk on the flat panel, the following conditions need to be simultaneously met: luminous intensity of the illumination field at a width of 7.5 mm needs to be smaller than 1/2000 of luminous intensity at the center of the illumination field (which can be known from the formulas 1 and 2); and luminous intensity of the illumination field at a width of 8.8 mm needs to be smaller than 1/5000 of luminous intensity at the center of the illumination field (which can be known from the formulas 3 and 4).

The above merely describes preferred embodiments of the present invention, and is not intended to limit the present invention. Any replacements and modifications made by persons of ordinary skill in the art according to the disclosed content should all fall within the protection scope of claims of the present invention.

What is claimed is:

1. A method for detecting degree of particulate contamination on a flat panel, comprising the following steps:
   illuminating a to-be-detected flat panel by using a light source, and thereby forming an illumination field;
   adjusting a half width of the illumination field;
   adjusting a luminous intensity at a center of the illumination field and a luminous intensity at an edge of the half width of the illumination field;
   adjusting a light intensity and a position of the light source, as well as a position of a detector; and
   acquiring signals from foreign objects on the to-be-detected flat panel by using the detector.

2. The method for detecting degree of particulate contamination on a flat panel according to claim 1, wherein the step of adjusting a half width of the illumination field comprises: enabling the half width of the illumination field to satisfy: s<=2h*tan θ−0.5w, wherein s indicates the half width of the illumination field, h indicates a thickness of the to-be-detected flat panel, θ indicates a refraction angle, in the to-be-detected flat panel, of a receiving angle of the detector, and w indicates a width of an imaging field.

3. The method for detecting degree of particulate contamination on a flat panel according to claim 2, wherein the step of adjusting a luminous intensity at a center of the illumination field and a luminous intensity at an edge of the half width of the illumination field comprises: enabling the luminous intensity at the center of the illumination field and the luminous intensity at the edge of the half width of the illumination field to satisfy: i_center/i_edge>(i_min p1/i_max p1_mir)*snr1, wherein i_center indicates the light luminous at the center of the illumination field, i_edge indicates the luminous intensity at the edge of the half width of the illumination field, i_min p1 indicates a received signal of a to-be-detected minimal particle, i_max p1_mir indicates a mirror crosstalk signal of a to-be-detected maximal particle, and snr1 indicates a signal-to-noise ratio required for suppressing particle crosstalk.

4. The method for detecting degree of particulate contamination on a flat panel according to claim 1, wherein the step of adjusting a half width of the illumination field comprises: enabling the half width of the illumination field to satisfy: s<=h*(tan θ+tan γ), wherein s indicates the half width of the illumination field, h indicates a thickness of the to-be-detected flat panel, θ indicates a refraction angle, in the to-be-detected flat panel, of a receiving angle of the detector, and γ indicates a refraction angle, in the to-be-detected flat panel, of an incident angle of the light source.

5. The method for detecting degree of particulate contamination on a flat panel according to claim 4, wherein the step of adjusting a luminous intensity at a center of the illumination field and a luminous intensity at an edge of the half width of the illumination field comprises: enabling the luminous intensity at the center of the illumination field and the luminous intensity at the edge of the half width of the illumination field to satisfy: i_center/i_edge>(i_min p2/i_max p2)*snr2, wherein i_center indicates the luminous intensity at the center of the illumination field; i_edge indicates the luminous intensity at the edge of the half width of the illumination field, i_min p2 indicates a received signal of a to-be-detected minimal pattern on the to-be-detected flat panel, i_max p2 indicates a maximal crosstalk signal of a pattern on the to-be-detected flat panel, and snr2 indicates a signal-to-noise ratio required for suppressing pattern crosstalk on the to-be-detected flat panel.

6. The method for detecting degree of particulate contamination on a flat panel according to claim 4, further comprising: selecting the incident angle of the light source and the receiving angle of the detector by using a simulation software, and configuring the light source and the detector according to the incident angle and the receiving angle.

7. The method for detecting degree of particulate contamination on a flat panel according to claim 1, wherein the detection unit is a planar-array camera, a linear-array camera, or a TDI linear-array camera.

8. The method for detecting degree of particulate contamination on a flat panel according to claim 1, wherein the light source is a laser source or an LED light source.

* * * * *